United States Patent
Cawthorne et al.

(10) Patent No.: US 7,759,966 B2
(45) Date of Patent: *Jul. 20, 2010

(54) METHODS AND SYSTEMS FOR EVALUATING PERMANENT MAGNET MOTORS

(75) Inventors: William R. Cawthorne, Milford, MI (US); Sean E. Gleason, West Bloomfield, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/197,868

(22) Filed: Aug. 25, 2008

(65) Prior Publication Data

US 2010/0045335 A1 Feb. 25, 2010

(51) Int. Cl.
*G01R 31/34* (2006.01)
*H02H 7/08* (2006.01)
(52) U.S. Cl. ............... 324/772; 318/118; 318/490
(58) Field of Classification Search ............ 324/772; 318/490, 118
See application file for complete search history.

(56) References Cited

U.S. PATENT DOCUMENTS

| | | | |
|---|---|---|---|
| 6,720,792 B2 * | 4/2004 | Raftari et al. | 324/772 |
| 7,423,401 B2 * | 9/2008 | Kinpara et al. | 318/490 |
| 2002/0113615 A1 * | 8/2002 | Atarashi | 324/772 |
| 2009/0033357 A1 * | 2/2009 | Lindsey et al. | 324/772 |

* cited by examiner

*Primary Examiner*—Ha Tran T Nguyen
*Assistant Examiner*—Emily Y Chan
(74) *Attorney, Agent, or Firm*—Ingrassia Fisher & Lorenz, P.C.

(57) ABSTRACT

A method for evaluating a permanent magnet motor, which includes a rotor with a plurality of magnets mounted thereon, and a stator with a plurality of windings in proximity to the rotor and coupled to an inverter, includes spinning the motor such that a voltage is induced in the windings of the stator and the inverter; measuring the voltage on the inverter; calculating the voltage constant from the motor from the measured voltage; comparing the voltage constant to accepted voltage constants; and identifying the motor as not acceptable if the voltage constant is outside of a range of the accepted voltage constants.

13 Claims, 2 Drawing Sheets

METHODS AND SYSTEMS FOR EVALUATING PERMANENT MAGNET MOTORS

TECHNICAL FIELD

The present invention generally relates permanent magnet motors, and more particularly relates to methods for evaluating permanent magnet motors.

BACKGROUND

Hybrid vehicle systems typically utilize one or more electric, permanent magnet motors as part of a transmission system that provides a propulsion source to compliment the engine. The accuracy of the manufacture, service, and operation of these motors to produce specified torque profiles is important to the consistent and efficient operation of the vehicle.

Various issues can arise in the manufacture, assembly, transport, service, and use of the motors that can affect the performance. For example, the magnet flux strength of the motors can be diminished due to factors such as the particular characteristics of the magnets, including field strength and effects of heat and vibration. Similarly, if the stators of the motors are not properly wound with the specified number of turns per coil, performance can be affected. Another factor that contributes to the performance of the motors is the material utilized to fabricate the stators of the motors. Typically, steel or a similar material forms part of the magnetic circuit through with the magnet flux of the motor flows. As an example, the magnetic permeability of the steel can vary with the types of material used to manufacture the motors, and this variation can impact the performance of the motor.

One mechanism of evaluating a motor involves the calculation and evaluation of a voltage constant, which is a function of the number of windings of the stator, the permeability of the flux path, and the field strength of the rotor magnets. Conventional methods calculate the voltage constant of the motor based on voltage measurements from the motor itself. However, these methods are typically unavailable when the motor is installed in the transmission.

Accordingly, it is desirable to provide methods for evaluating permanent magnet motors in transmissions in a variety of situations, such as during operation, after manufacturing or during service of the vehicle. In addition, it is desirable to provide such methods in an economical and convenient manner. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with an exemplary embodiment, a method is provided for evaluating a permanent magnet motor, which includes a rotor with a plurality of magnets mounted thereon, and a stator with a plurality of windings in proximity to the rotor and coupled to an inverter. The method includes spinning the motor such that a voltage is induced in the windings of the stator and the inverter; measuring the voltage on the inverter; calculating the voltage constant from the motor from the measured voltage; comparing the voltage constant to a set of accepted voltage constants; and identifying the motor as not acceptable if the voltage constant is outside of a range of the set of accepted voltage constants.

In accordance with another exemplary embodiment, a method is provided for evaluating permanent magnet motors in a transmission during operation. The motors includes first and second motors, each including a rotor with a plurality of magnets mounted thereon, and a stator with a plurality of windings in proximity to the rotor and coupled to first and second inverters. The method includes measuring a first voltage for the first motor on the first inverter; calculating a first voltage constant of the first motor from the first voltage; comparing the first voltage constant to a set of accepted voltage constants; and identifying the first motor as not acceptable if the first voltage constant is outside of a range of the accepted voltage constants.

In accordance with yet another exemplary embodiment, an automotive system includes an internal combustion engine; and a two-mode, compound-split, electromechanical transmission coupled to the internal combustion engine. The transmission includes an input member to receive power from the internal combustion engine; an output member to deliver power from the transmission; a first motor and a second motor that are coaxially aligned and coupled to the output and input members; a power inverter coupled to the first and second motors; a measurement device coupled to the power inverter for measuring a first voltage from the first motor; and a processor coupled to the measurement device. The processor is configured to receive the first voltage measured by the measurement device; calculate a first voltage constant from the first voltage; compare the first voltage constant to an accepted voltage constant; and identify the first motor as not acceptable if the first voltage constant varies by more than a predetermined amount from the accepted voltage constant.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Exemplary embodiments described herein provide a method for evaluating permanent magnet motors within a two-mode, hybrid, compound-split, electromechanical transmission. Evaluation methods are particularly provided after manufacturing or during service of the transmission by calculating a voltage constant based on voltage measurements taken at the inverter coupled to the motors and comparing the voltage constant to predetermined values. If the calculated voltage constant is within an acceptable threshold range from the predetermined values, then it can be determined that the motors were properly manufactured, installed, and/or maintained.

In the description below, the structural and functional components of the transmission and motors are first described, including an explanation of the relationship between the voltages generated by the motor within the transmission and the voltages measured at the inverters. The conditions and methods for evaluating the motors will then be provided in further detail.

Figure 1:
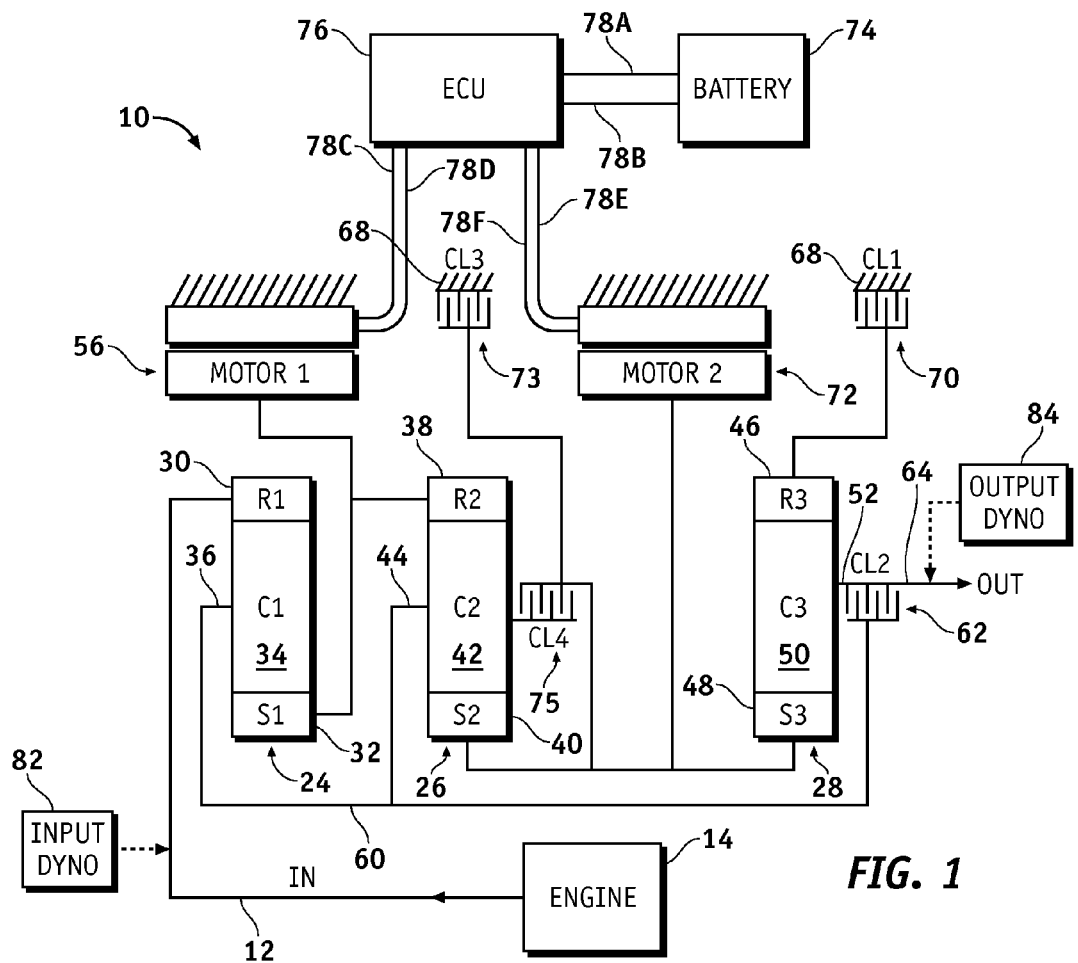
FIG. 1 is a block diagram of a two-mode, hybrid, compound-split, electromechanical transmission in accordance with an exemplary embodiment.

In accordance with an exemplary embodiment, a two-mode, hybrid, compound-split, electromechanical transmission 10 is depicted in FIG. 1. The hybrid transmission 10 has an input member 12, such as a shaft, that may be directly driven by an engine 14. A transient torque damper (not shown) may be incorporated between the engine 14 and the input member 12 of the transmission 10.

The engine 14 may be a fossil fuel engine, such as a diesel engine. In the exemplary embodiment, the engine 14, after start-up, and during the majority of its input, operates at a range of speeds from approximately 600 to approximately 6000 RPM. Although the particular speed and horsepower output of the engine 14 can vary, for the purpose of effecting a clear understanding of the hybrid transmission 10, an available output of about 300 horsepower from engine 14 will be assumed for the description of an exemplary installation.

The transmission 10 includes three planetary gear sets 24, 26 and 28. The first planetary gear set 24 is connected to the input member 12 and has a ring (or "outer") gear member 30 that circumscribes a sun (or "inner") gear member 32. Any number of planet gear members 34 are rotatably mounted on a carrier 36 such that each planet gear member 34 can rotate and mesh with both the outer gear member 30 and the sun gear member 32.

The second planetary gear set 26 also has a ring gear member 38 circumscribing a sun gear member 40. A number of planet gear members 42 are rotatably mounted on a carrier 44 such that each planet gear 42 engages both the ring gear member 38 and the sun gear member 40.

The third planetary gear set 28 also has a ring gear member 46 circumscribing a sun gear member 48. A number of planet gear members 50 are rotatably mounted on a carrier 52 such that each planet gear 50 engages both the ring gear member 46 and the sun gear member 48.

The first and second planetary gear sets 24 and 26 are compounded in that the sun gear member 32 of the first planetary gear set 24 is conjoined, as through a hub plate gear (or first interconnecting member) 54, to the ring gear member 38 of the second planetary gear set 26. The conjoined sun gear member 32 of the first planetary gear set 24 and the ring gear member 38 of the second planetary gear set 26 are continuously coupled to a first motor 56. As used herein, the term "motor" can include a generator. The first motor 56 is described in further detail below.

The first and second planetary gear sets 24 and 26 are further compounded in that the carrier 36 of the first planetary gear set 24 is conjoined, as through a shaft 60, to the carrier 44 of the second planetary gear set 26. As such, carriers 36 and 44 of the first and second planetary gear sets 24 and 26, respectively, are conjoined. The shaft 60 selectively connects to the carrier 52 of the third planetary gear set 28 through a clutch (or "second clutch" CL2) 62, which assists in the selection of the operational modes of the hybrid transmission 10. As used herein the term "clutch" refers to any device capable of transmitting rotation that can be engaged and disengaged, such as for example, a friction clutch, a multi-plate wet clutch, a magnetorheological (MR) fluid clutch, or a motor-generator clutch.

The carrier 52 of the third planetary gear set 28 is coupled directly to the transmission output member 64. When the hybrid transmission 10 is used in a land vehicle, the output member 64 may be connected to the vehicular axles (not shown) that may, in turn, terminate in the drive members (also not shown). The drive members may be either front or rear wheels of the vehicle on which they are employed, or they may be the drive gear of a track vehicle.

The ring gear member 46 of the third planetary gear set 28 selectively couples to ground, represented by the transmission housing 68, through a clutch (or "a first clutch" CL1) 70. The first clutch 70 also assists in the selection of the operational modes of the hybrid transmission 10, as will be described in further detail below. The sun gear 48 is continuously coupled to a second motor 72. All the planetary gear sets 24, 26 and 28 as well as the two motors 56 and 72 are shown coaxially oriented, as about the axially disposed shaft 60. Both motors 56 and 72 are shown in this embodiment as being of an annular configuration that permits them to circumscribe the three planetary gear sets 24, 26 and 28 such that the planetary gear sets 24, 26 and 28 are disposed radially inwardly of the motor 56 and 72. This configuration assures that the overall envelope, i.e., the circumferential dimension, of the transmission 10 is minimized.

Figure 2:
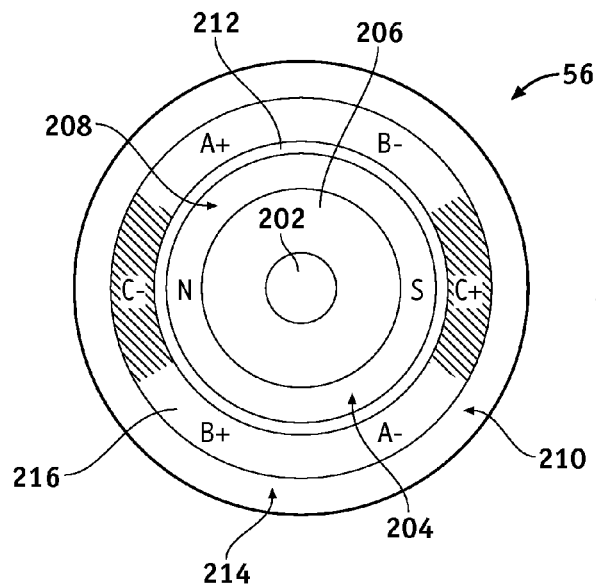
FIG. 2 is a cross-sectional representation of an exemplary electric motor.

A clutch (or "third clutch" CL3) 73 selectively couples the sun gear 40 with ground (i.e., with transmission housing 68). A clutch (or "fourth clutch" CL4) 75 is operative as a lock-up clutch, locking planetary gear sets 24, 26, motor 56, and the input 12 to rotate as a group, by selectively coupling the sun gear 40 with the carrier 44. The sun gear 40 is also coupled to the sun gear 48. Although one exemplary transmission arrangement is depicted in FIG. 2, the systems and methods disclosed herein can be provided for any gearing and clutch configuration.

The transmission 10 operates as a two-mode, compound-split, electromechanical, vehicular transmission. "Modes" of operation refer to circumstances in which the transmission functions are controlled by one clutch (e.g., clutch 62 or clutch 70), and the controlled speed and torque of the motor 56 and 72, one example of which is described in U.S. Pat. No. 5,009,301 which issued on Apr. 23, 1991 to General Motors Corporation. In one exemplary embodiment, a first mode is selected when the first clutch 70 is actuated in order to "ground" the ring gear member 46 of the third planetary gear set 28. A second mode is selected when the first clutch 70 is released and the second clutch 62 is simultaneously actuated to connect the shaft 60 to the carrier 52 of the third planetary gear set 128.

Additionally, certain "ranges" of operation may be achieved by applying an additional clutch (e.g., clutch 62, 73 or 75). When the additional clutch is applied (i.e., when two clutching mechanisms are applied), a fixed input to output speed ratio (i.e., a fixed gear ratio) is achieved. The rotations of the motors 56 and 72 will then be dependent on internal rotation of the mechanism as defined by the clutching and proportional to the input speed. In one embodiment, the first range falls within the first mode of operation when the first and fourth clutches 70 and 75 are engaged, and the second range falls within the first mode of operation when the first and second clutches 62 and 70 are engaged. A third fixed ratio range is available during the second mode of operation when the second and fourth clutches 62 and 75 are engaged, and a fourth fixed ratio range is available during the second mode of operation when the second and third clutches 62 and 73 are engaged.

The transmission 10 selectively receives power from the engine 14. The transmission 10 also receives power from an electric storage device 74. The electric storage device 74 may be one or more batteries or other types of storage devices. The electric storage device 74 communicates with an electrical control unit (ECU) 76 by transfer conductors 78A and 78B. The ECU 76 communicates with the first motor 56 by transfer conductors 78C and 78D, and the ECU 76 similarly communicates with the second motor 72 by transfer conductors 78E and 78F.

The ECU 76 obtains information from both the first and second motors 56 and 72, respectively, the engine 14 and the electric storage device 74. In response to an operator's action, or "operator demand" (e.g., from a drive range selector, an accelerator pedal, and/or a brake pedal), the ECU 76 determines what is required and then manipulates the selectively operated components of the hybrid transmission 10 appropriately to respond to the operator demand.

FIG. 2 illustrates a cross sectional view of the motor 56 utilized in the transmission 10 described above. The motor 56 is described to provide a greater understanding of the exemplary motor evaluation methods described below. The motor depicted in FIG. 2 is labeled as the first motor 56, although it could also represent the second motor 72.

The motor 56 can be a two pole, three phase, brushless permanent magnet machine, although the description below can be applicable to any number of poles. The motor 56 includes a shaft 202 for providing input to the motor 56 and receiving output from the motor 56. A rotor 204 is coupled to the shaft 202 and includes a rotor core 206 with permanent magnets 208 mounted thereon. A stator 210 is separated from the rotor 204 by an air gap 212 and includes a stator core 214 with armature windings 216 positioned thereon.

As the rotor 204 rotates with respect to the windings 214 on the stator 210, a voltage is induced in the windings 216 as specified by Faraday's Law, which is expressed as Equations (1) below.

$$e_{ind} = -\frac{d\lambda}{dt} \quad (1)$$

where $\lambda$ is the total flux linking the stator winding and $e_{ind}$ is the voltage induced on the coil.

Assuming the magnets 208 are evenly distributed around the rotor 204, the flux linkage can be written as Equation (2).

$$\lambda = K_v \sin(\omega t) \quad (2)$$

where $K_v$ is the voltage constant of the motor and $\omega$ is the rotational frequency of the motor.

The voltage constant $K_v$ is a function of various parameters of the motor design including: the number of winding 216 turns of the stator 210; the magnet field strength of the rotor 204; and the permeability of the flux path in the motor 56. Substituting Equation (2) into Equation (1) results in Equation (3).

$$e_{ind} = -\frac{d\lambda}{dt} \quad (3)$$

-continued
$$= -\frac{d(K_v \sin(\omega t))}{dt}$$
$$= -K_v \omega \cos(\omega t)$$

Equation (3) demonstrates that the magnitude of the voltage included on a phase of a winding 216 of the stator 210 is proportional to the voltage constant $K_v$ and the rotational speed of the motor 56.

Equation (4) illustrates that the voltage constant $K_v$ is a function of the number of turns of the windings 216, the permeability of the flux path, and the strength of the magnets 208, as shown below.

$$K_v = f(N, \mu, \Phi) \quad (4)$$

where N is the number of turns in the stator windings, $\mu$ is the permeability of the flux path, and $\Phi$ is the field strength of the rotor magnets.

Thus, Equation (3) for the induced voltage can be written as Equation (5), as shown below.

$$e_{ind} = -f(N, \mu, \Phi) \omega \cos(\omega t) \quad (5)$$

As shown in Equation (5), the magnitude of the induced voltage is the product of the angular velocity of the rotor 204 and a function of the number of turns of the windings 216, the permeability of the steel of the stator 210, and the strength of the magnets 208. If any of these parameters do not match the design criteria, the induced voltage on the motor 56 for a given speed will not match the values calculated based on the design values.

Figure 3:
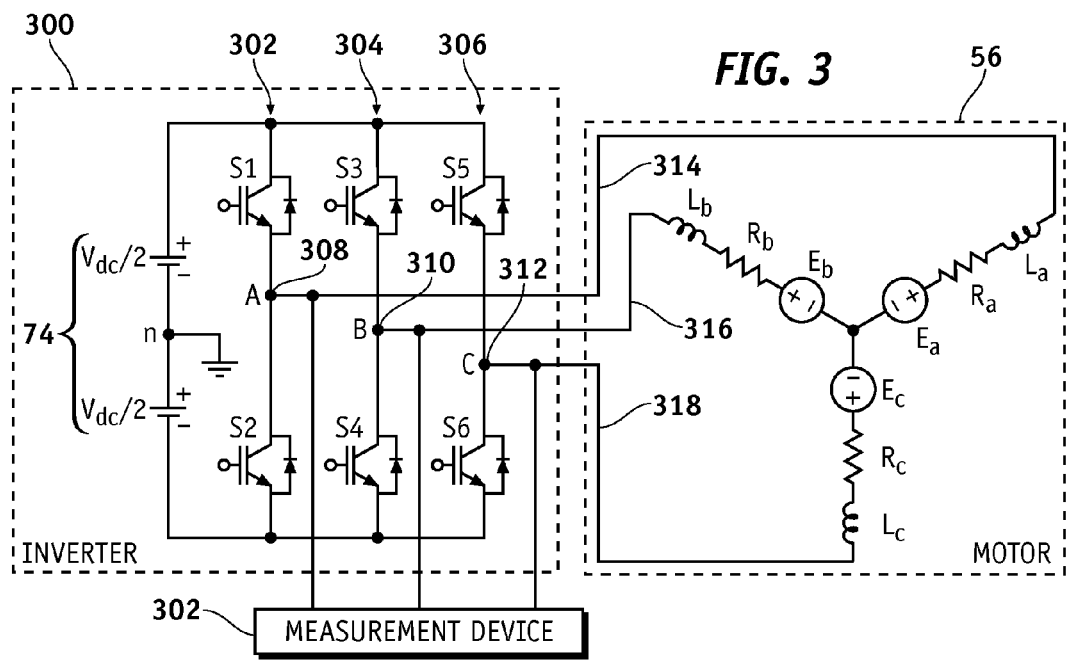
FIG. 3 is a schematic representation of an evaluation system for the electric motor of FIG. 2 in accordance with an exemplary embodiment.

Referring to FIG. 3, the motor 56 includes, or can be coupled to, an inverter 300 to facilitate power flow to and from the motor 300. In one exemplary embodiment, a measurement device 302 measures voltages at the inverter 300. As described below, under certain conditions, the voltages measured at the inverter 300 correspond to the voltages induced on the windings 216 of the stator 210 of the motor 56. As such, the voltages measured at the inverter 300 can used in an evaluation of the motor 56.

The inverter 300 is a three phase circuit coupled to the motor (depicted as the first motor 56, although it could also be the second motor 72). The inverter 300 includes three pairs of series switches 302, 304, and 306 coupled to the battery 74 and the motor 56. The first pair of switches 302 is coupled to the first phase 314 of the motor 56 at a first terminal 308. The second pair of switches 304 is coupled to the second phase 316 of the motor 56 at the second terminal 310. The third pair of switches 306 is coupled to the third phase 318 of the motor 56 at the third terminal 312.

During operation, the inverter 300 creates a three phase voltage on terminals 308, 310, and 312 by changing the states of the three pairs of switches 302, 304, and 306. As an example, the voltage at the inverter 300 (assuming current flowing out of inverter as positive) between two phases (A and B) is illustrated by Equation (6).

$$Vab = La\frac{dIa}{dt} + RaIa + Ea - Eb - RbIb - Lb\frac{dIb}{dt} \quad (6)$$

Typically, the inverter 300 actuates the switches 302, 304, and 306 to control the current that flows in and out of each terminal 308, 310, and 312. If, as stated above, the inverter 300 is commanded to control zero current in the phase terminals using, for example, closed loop current regulators, when Ia=Ib=dIa/dt=dIb/dt=0, and the inverter voltage equation reduces to Equation (7).

$$Vab=Ea-Eb \tag{7}$$

Since the currents are assumed zero, the induced voltage from Equation (3), can be equated with the terminal voltage given in Equation (7) to result in Equation (7).

$$Vab=-K_v \omega \cos(\omega t) \tag{8}$$

The relationship between quantities measured in the physical reference frame and a mathematical dq frame is illustrated in Equation (9).

$$\begin{bmatrix} f_d \\ f_q \end{bmatrix} = \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} f_a \\ f_b \\ f_c \end{bmatrix} \tag{9}$$

where f can replaced with appropriate physical quantity, e.g., voltage, current, or flux.

Based on the transformation above in Equation (9), current regulators that control the switches 302, 304, and 306 can be expressed in the form of Equations (10).

$$Vd=PI_{regulator}(I_{d\ commanded}-I_{d\ measured})$$

$$Vq=PI_{regulator}(I_{q\ commanded}-I_{q\ measured}) \tag{10}$$

The current regulators work on the measured current, as compared to the commanded current. As noted above, the commanded currents are designated as zero by the inverter 300. Therefore, all of the non-zero terms on the right side of Equation (10) are measurable and the voltage that is needed to keep the currents zero is calculated as the current regulators drive the measured current to the desired current. The magnitude of the developed voltage can be calculated as shown in Equation (11).

$$Vref=\sqrt{V_d^2+V_q^2} \tag{11}$$

The voltage should be measured below base speed, i.e., when the inverter output voltage is maximum. In other words, the base speed is the point at which the induced voltage on the motor 56 or 72 matches the supply voltage available to the inverter 300. Comparing Vref of Equation (11) to Equation (8), and knowing the motor speed from measurement, the voltage constant Kv of the either of the motors 56 and 72 can be calculated and compared against a set of accepted values to thus evaluate the motor 56 or 72.

In accordance with an exemplary embodiment, the motors 56 and 72 can be evaluated during operation. Knowledge of the voltage constants of the first and second motors 56 and 72 during vehicle operation is desirable for several reasons. First, the fidelity of the control of the first and second motors 56 and 72 can be improved by comprehending changes in the voltage constant over the life of the first and second motors 56 and 72. For example, magnet field strength changes can impact the operation of the first and second motors 56 and 72. The control fidelity is improved by updating the switching commands to the first and second motors 56 and 72 based on the knowledge of the changes in the first and second motors 56 and 72. Additionally, knowledge of the voltage constant of the first and second motors 56 and 72 can be used to trigger diagnostics and to provide warning to the automobile owners if one of the first and second motors 56 and 72 is experience performance issues.

When the vehicle is in operation, the first and second motors 56 and 72 will rotate with various speed relationships in dependence on the configuration of the clutches 70, 62, 73, and 75 in the transmission 10. The speed relationships and configurations can be utilized to determine the voltage constant of the first and second motors 56 and 72 during operation.

For example, in the first fixed gear, both the first and second motors 56 and 72 and the input speed at the input member 12 are all maintained at the same rotational speed by the gearing and clutch configuration. Additionally, the engine 14 is directly coupled to the transmission output 64 through the gear ratio of the transmission 10. This allows the transmission 10 to provide propulsion torque to the vehicle, and to spin the first and second motors 56 and 72 solely with the torque from the engine 14. Thus, the first and second motors 56 and 72 will spin at the same speed as the engine 14, but will not be required to generate torque. When these conditions exist, the ECU 76 can enter an operational test mode and utilize the inverter voltage of the first and second motors 56 and 72 to determine the voltage constants.

Figure 4:
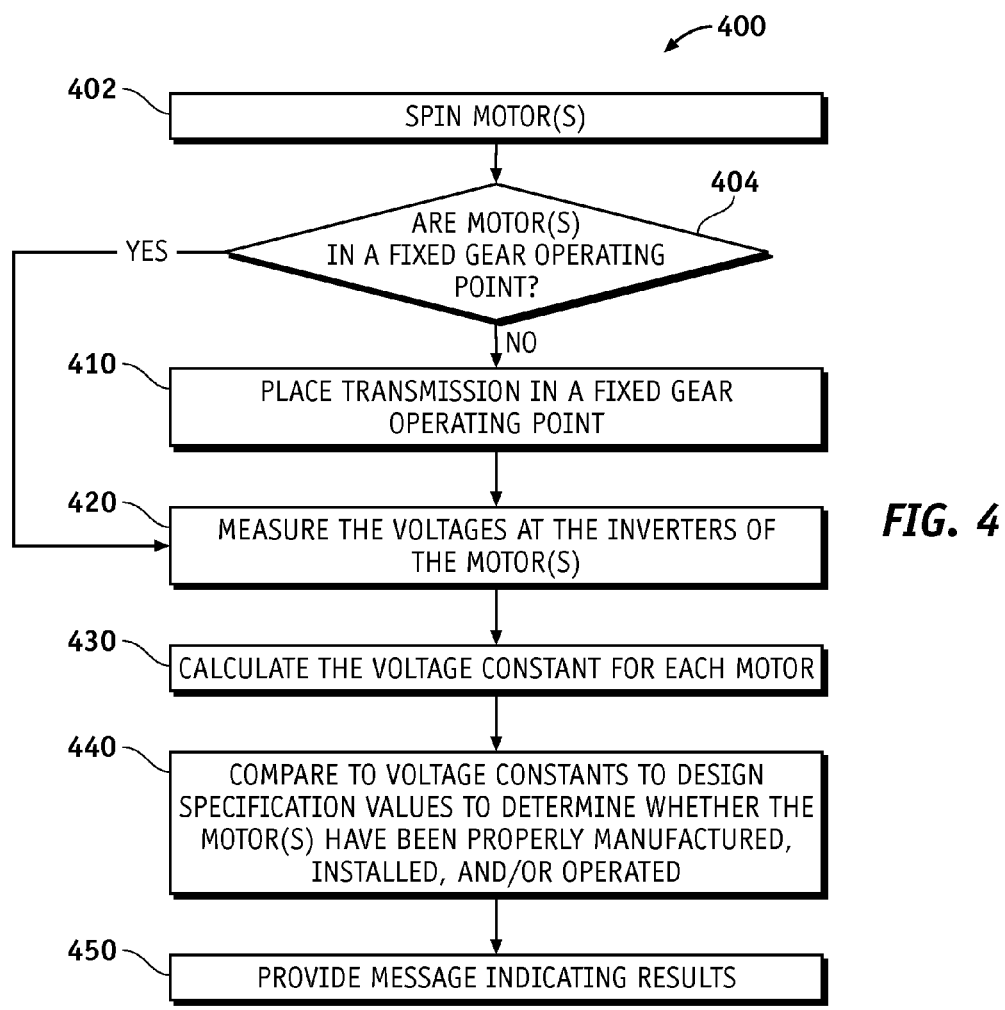
FIG. 4 illustrates an exemplary method for evaluating a motor during operation.

Accordingly, referring additionally to FIG. 4, the first step 402 of a method 400 for evaluating the motors 56 and 72 during operation is to spin the motors 56 and 72. In a step 404, the method evaluates whether or not the motors 56 and 72 are in a fixed gear operating point. If not, transmission 10 is placed into a fixed gear operating point, as indicated by step 410. The first and second motors 56 and 72 can be tested any time the transmission 10 is in a fixed gear state since the motor torques are not required to satisfy the vehicle torque requests. In fixed gears, the operating point selection algorithms naturally tend to select points that require low motor torques based on the efficiency of these operating points. At low torque values, there is very little power loss. If the gear ratio is such that the engine 14 is also using fuel at these points, the hybrid optimization algorithms selected operating points where the motor torques are low or zero to eliminate any electrical loss. Therefore, during the course of normal driving, many opportunities are present to conduct the test of the first and second motors 56 and 72. However, particularly advantageous circumstances can be utilized for the operational test of the first and second motors 56 and 72.

The operating point selection logic in the ECU 76 can be modified to favor fixed gear operating points that require no motor torque, particularly if a significant amount of time has passed since the system was in this type of operating point. This allows the ECU 76 regular opportunities to conduct the operational test.

In one exemplary embodiment, the ECU 76 can place the transmission in an operating condition in which the operational test could be conducted. In this embodiment, the ECU 76 can apply the more detailed information it has relative to the last time a successful test was completed and the operation of the first and second motors 56 and 72 to determine when a test is needed. This enables the ECU 76 to periodically test the motors 56 and 72 at more favorable points. Generally, these points would correspond to fixed gear, low motor speed operating points.

When these conditions are present, in a fourth step 420, the voltages at the inverters of the first and second motors 56 and 72 can be measured by the measurement device 302 (FIG. 3). The measurement device 302 can be, for example, a sensor or other suitable device for measuring the voltage at the inverter. After measurement, in a fifth step 430 and a sixth step 440, the voltage constants of the first and second motors 56 and 72 can be calculated and compared to the design specification value to evaluate the motors 56 and 72. If the voltage constants derived from the voltage measurements of the first and second motors 56, 72 are within an acceptable threshold of the predetermined values, then the motors 56, 72 are deemed to be properly manufactured, installed, and/or maintained. Conversely, if the voltage constants are outside of the threshold, it may indicate an issue with the motors 56, 72. In this scenario, a service message indicating the results may be provided, as indicated in step 450.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for evaluating a permanent magnet motor, the motor comprising a rotor with a plurality of magnets mounted thereon, and a stator with a plurality of windings in proximity to the rotor, wherein the windings are coupled to an inverter, the method comprising:
    spinning the motor such that a voltage is induced in the windings of the stator and the inverter;
    measuring the voltage on the inverter;
    calculating the voltage constant from the motor from the measured voltage;
    comparing the voltage constant to a set of accepted voltage constants; and
    identifying the motor as not acceptable if the voltage constant is outside of a range of the set of accepted voltage constants.

2. The method of claim 1, wherein the permanent magnet motor is a first motor and the voltage is a first voltage, the transmission further including a second motor having a second rotor with a second plurality of magnets mounted thereon, and a second stator with a second plurality of windings in proximity to the rotor, wherein the second windings are coupled to the inverter, the method further comprising:
    spinning the second motor such that the second rotor induces a second voltage n the second stator windings and the inverter;
    measuring a second voltage on the inverter;
    calculating a second voltage constant of the second motor from the second voltage;
    comparing the second voltage constant to a set of accepted voltage constants; and
    identifying the second motor as not acceptable if the second voltage constant is outside of a range of the set of accepted voltage constants.

3. The method of claim 2, wherein the step of measuring the first voltage includes measuring the first voltage at the inverter for three phases of the first motor.

4. The method of claim 2, wherein the second voltage measuring step includes measuring the second voltage at the inverter for three phases of the second motor.

5. A method for evaluating permanent magnet motors in a transmission during operation, the motors comprising first and second motors, each including a rotor with a plurality of magnets mounted thereon, and a stator with a plurality of windings in proximity to the rotor, wherein the windings of the first and second motor are respectively coupled to first and second inverters, the method comprising:
    measuring a first voltage for the first motor on the first inverter;
    calculating a first voltage constant of the first motor from the first voltage;
    comparing the first voltage constant to a set of accepted voltage constants; and
    identifying the first motor as not acceptable if the first voltage constant is outside of a range of the set of accepted voltage constants.

6. The method of claim 5, further comprising
    measuring a second voltage for the second motor on the second inverter;
    calculating a second voltage constant of the second motor from the second voltage;
    comparing the second voltage constant to a set of accepted voltage constants; and
    identifying the second motor as not acceptable if the second voltage constant is outside of a range of the set of accepted voltage constants.

7. The method of claim 5, further comprising, prior to the measuring step, determining whether the transmission is in a fixed gear.

8. The method of claim 7, further comprising postponing the measuring step until the transmission is in the fixed gear.

9. The method of claim 5, further comprising placing the transmission in the fixed gear prior to the measuring step.

10. The method of claim 5, wherein the measuring, calculating, comparing, and identifying steps are a first test, and the method comprises repeating the measuring, calculating, comparing, and identifying steps as a second test at a predetermined time interval from the first test.

11. The method of claim 5, wherein the measuring, calculating, comparing, and identifying steps are conducted at a first operating point, and wherein the method further comprises selecting an operating point that requires no motor torque.

12. The method of claim 5, further comprising sending a service message if the first voltage constant is outside of the set of the accepted voltage constants.

13. The method of claim 5, wherein the voltage measuring step includes measuring the first voltage for three phases of the first motor.

* * * * *